(12) United States Patent
Huang et al.

(10) Patent No.: US 10,948,559 B2
(45) Date of Patent: Mar. 16, 2021

(54) METHOD OF PROCESSING MR IMAGES TO ESTIMATE A LONGITUDINAL RELAXATION TIME CONSTANT

(71) Applicants: Siemens Healthcare Limited, Camberley (GB); King's College London, London (GB)

(72) Inventors: Li Huang, London (GB); Radhouene Neji, London (GB); Sebastien Roujol, Kingston upon Thames (GB)

(73) Assignees: Siemens Healthcare Limited, Camberley (GB); King's College, London, London (GB)

( * ) Notice: Subject to any disclaimer, the term of this patent is extended or adjusted under 35 U.S.C. 154(b) by 49 days.

(21) Appl. No.: 16/428,770

(22) Filed: May 31, 2019

(65) Prior Publication Data

US 2019/0369189 A1 Dec. 5, 2019

(30) Foreign Application Priority Data

May 31, 2018 (GB) ..................................... 1808901

(51) Int. Cl.
*G01R 33/50* (2006.01)
*G01R 33/56* (2006.01)
(Continued)

(52) U.S. Cl.
CPC ......... *G01R 33/50* (2013.01); *G01R 33/5608* (2013.01); *G06K 9/42* (2013.01);
(Continued)

(58) Field of Classification Search
CPC ................ G01R 33/50; G01R 33/5602; G01R 33/5608; G01R 33/5614; G06K 9/42; G06K 9/46; G06T 11/005; G06T 2210/41
See application file for complete search history.

(56) References Cited

U.S. PATENT DOCUMENTS 9,547,059 B2 * 1/2017 Greiser .................. G01R 33/56
2003/0097065 A1 5/2003 Lee
(Continued)

OTHER PUBLICATIONS

Hui Xue et al: "Phase-Sensitive Inversion Recovery for Myocardial T1 Mapping with Motion Correction and Parametric Fitting"; Magnetic Resonance in Medicine 69:1408-1420 (2013); pp. 1408-1420; 2013.
(Continued)

*Primary Examiner* — Bobbak Safaipour
(74) *Attorney, Agent, or Firm* — Schiff Hardin LLP (57) ABSTRACT

A method of estimating a longitudinal magnetic relaxation T1 time for a region of a subject. The method includes providing a computer with at least two magnetic resonance (MR) images of the region of the subject that were respectively acquired at different times after the generation of a preparation pulse during a MR pulse sequence; in said computer, analyzing said at least two MR images in order to obtain, from the same location in each of the MR images, a pixel value, wherein each of the pixel values and the time at which their respective MR image was acquired form a data point; and in said computer, fitting the data points to a model representing said longitudinal magnetic relaxation by varying a single adjustable parameter to estimate the T1 time constant for the region of interest, wherein the single adjustable parameter represents a T1 time constant within the model.

17 Claims, 2 Drawing Sheets

(51) Int. Cl.
  *G06K 9/46* (2006.01)
  *G06K 9/42* (2006.01)
  *G06T 11/00* (2006.01)

(52) U.S. Cl.
  CPC .............. *G06K 9/46* (2013.01); *G06T 11/005* (2013.01); *G06T 2210/41* (2013.01)

(56) References Cited

U.S. PATENT DOCUMENTS

| | | |
|---|---|---|
| 2004/0008891 A1 | 1/2004 | Wentland et al. |
| 2005/0010098 A1 | 1/2005 | Frigstad |
| 2006/0171586 A1 | 8/2006 | Georgescu et al. |
| 2006/0241455 A1 | 10/2006 | Shvarts |
| 2007/0014457 A1 | 1/2007 | Jolly et al. |
| 2007/0055153 A1 | 3/2007 | Simopoulos et al. |
| 2009/0015257 A1* | 1/2009 | Hughes .................. A61B 5/055 324/309 |
| 2009/0226081 A1 | 9/2009 | Zhou et al. |
| 2010/0266175 A1 | 10/2010 | Seung |
| 2011/0231593 A1 | 9/2011 | Yasufuku |
| 2013/0278259 A1 | 10/2013 | Greiser |
| 2014/0221832 A1 | 8/2014 | El-Zehiry et al. |
| 2015/0212178 A1* | 7/2015 | Shu ........................ G01R 33/50 324/309 |
| 2018/0217217 A1* | 8/2018 | Weingartner ........ A61B 5/0044 |
| 2020/0132796 A1* | 4/2020 | Roujol ............... G01R 33/5673 |
| 2020/0249299 A1* | 8/2020 | Botnar .................. G06T 7/0012 |

OTHER PUBLICATIONS

P. Kellman et al—Adiabatic inversion pulse for myocardial T1 mapping. Magnetic resonance in medicine 2014;71(4); 1428-1434.

D. McRobbie et al—MRI from Picture to Proton. Cambridge: Cambridge University Press. doi :10.1017/9781107706958 (pp. 136-137).

* cited by examiner

METHOD OF PROCESSING MR IMAGES TO ESTIMATE A LONGITUDINAL RELAXATION TIME CONSTANT

TECHNICAL FIELD

The present disclosure relates to a method and apparatus for processing magnetic resonance (MR) images. In particular, the present disclosure relates to a method of and apparatus for processing MR images so as to estimate a longitudinal T1 relaxation time constant.

BACKGROUND

T1 relaxation time constant, also known as the spin-lattice or longitudinal relaxation time, is a measure of how fast the nuclear spin magnetization returns to its equilibrium state after an excitation pulse. T1 is a key source of soft tissue contrast in MRI.

Estimating T1 times and using the T1 times to generate a T1 map of an examination area provides a useful tool for a medical professional to identify diseases, lesions and abnormalities in soft tissue that affect T1. T1 mapping is useful to characterize diffuse or infiltrative myocardial diseases, including cardiomyopathies, myocarditis, and amyloidosis.

T1 mapping, and in particular cardiac T1 mapping or myocardial T1 mapping, may be performed using specific MR pulse sequences.

One such MR pulse sequence is commonly known as the MOdified Look-Locker Inversion recovery (MOLLI) which may be used for myocardial T1 mapping. In an example MOLLI sequence, an inversion pulse is generated and followed by the acquisition of five images. The five images are acquired during the diastolic period of the cardiac cycle within five successive heartbeats. The diastolic period is the phase of the heartbeat when the myocardium relaxes to allow the chambers of the heart to fill with blood. After the acquisition of the five images, there is a rest period of three heartbeats, before the sequence is repeated for three heartbeats. The inversion pulse and the image acquisitions are electrocardiogram, ECG, triggered meaning that a cardiac event as measured by an ECG apparatus triggers the generation of the inversion pulse and the image acquisitions.

Here, an "inversion pulse" means a 180 degrees excitation pulse that acts to flip the initial longitudinal magnetization of a subject's tissue to point opposite to the direction of the main (e.g. static) magnetic field.

The resultant images may then be sorted in ascending order with respect to the time after the generation of the inversion pulse, the inversion time (TI), and the signal intensity in each pixel of the image may be fit onto an apparent T1 recovery curve during a T1 fitting process. The apparent T1 recovery curve may follow a three-parameter model $S(t)=A-B \exp(-t/T1^*)$ where $S(t)$ is the signal intensity at time t after application of the inversion pulse. A, B and $T1^*$ are the parameters to be estimated by the curve fitting. $T1^*$ is the apparent recovery time rather than the actual recovery time T1. T1 can be calculated by applying the correction $T1=T1^* \times ((B/A)-1)$. In some examples, the correction $T1=T1^* \times ((B/A)-1)/C$ may be applied where C is an inversion factor of the inversion pulse. After computing the T1 time for each pixel, a T1 map for the region of interest may be generated.

Another such specialized pulse sequence is commonly known as the SAturation-recovery-Single-SHot Acquisition (SASHA) which may also be used for myocardial T1 mapping. SASHA is also ECG triggered, and within each cardiac cycle during the SASHA sequence, a saturation pulse is generated followed by an image acquisition. In SASHA, each of the images is acquired at the same point in the cardiac cycle, but with different times after the application of the saturation pulse.

Here, a saturation pulse refers to a 90 degrees excitation pulse that acts to tip the initial longitudinal magnetization of a subject's tissue into the transverse magnetization plane.

The resultant images may then be sorted in order of increasing time after the application of the saturation pulse and the signal intensity in each pixel of the image may be fit onto a T1 recovery curve during a T1 fitting process. The T1 recovery curve may follow a three-parameter model $S(t)=A-B \exp(-t/T1)$ where $S(t)$ is the signal intensity at time t after application of the saturation pulse. A, B and T1 are the parameters to be estimated by the curve fitting. After computing the T1 for each pixel, a T1 map for the region of interest may be generated. A two-parameter model $S(t)=A(1-2\exp(-t/T1))$ may also be used.

Another such specialized pulse sequence is commonly known as the Saturation-Pulse Prepared Heart-rate independent Inversion-REcovery (SAPPHIRE) which may also be used for myocardial T1 mapping. SAPPHIRE is also ECG triggered, and within each cardiac cycle during the SAPPHIRE sequence, a saturation pulse is generated followed by an inversion pulse and an image acquisition. In SAPPHIRE, each of the images is acquired at the same point in the cardiac cycle, but with different times after the application of the saturation pulse and inversion pulse.

The resultant images may then be sorted in order of increasing time after the application of the saturation pulse and the signal intensity in each pixel of the image may be fit onto a T1 recovery curve during a T1 fitting process. The T1 recovery curve may follow a three-parameter model $S(t)=A(1-B(2-\exp(-Tsatinv/T1)) \exp(-t/T1)$ where $S(t)$ is the signal intensity at time t after application of the saturation pulse. Tsatinv is the time between the saturation and the inversion pulse. A, B and T1 are the parameters to be estimated by the curve fitting. After computing the T1 for each pixel, a T1 map for the region of interest may be generated. A two-parameter model $S(t)=A(1-(2-\exp(-Tsatinv/T1)) \exp(-t/T1)$ may also be used.

It is an object of the present disclosure to improve or at least provide alternatives to existing approaches for estimating T1 times using MR images.

According to a first aspect of the present disclosure, there is provided a method of estimating a longitudinal magnetic relaxation time, T1, constant for a region of a subject, the method comprising:
  obtaining at least two magnetic resonance, MR, images of the region of the subject, the MR images being acquired at different times after the generation of a preparation pulse during a MR pulse sequence;
  obtaining, from the same location in each of the MR images, a pixel value, wherein each of the pixel values and the time at which their respective MR image was acquired form a data point
  fitting the data points to a model representing said magnetic relaxation by varying a single adjustable parameter to estimate the T1 time constant for the region of interest, wherein the single adjustable parameter represents the T1 time constant within the model.

Preferably, the method includes providing a plurality of different models representing said magnetic relaxation which differ according to a respective value of the single adjustable parameter employed therein and wherein said fitting the data points to a model comprises selecting a model which provides the best fit from amongst the plurality of different models.

Fitting the data points to the model may comprise calculating an optimal value of the single adjustable parameter to be employed in the model.

The method may comprise estimating a plurality of T1 times, wherein each of the T1 times is for a different location in the MR images, and wherein the method may comprise, for each of the different locations in the MR images:
  obtaining, from the location in each of the MR images, a pixel value wherein each of the pixel values and the time at which their respective MR image was acquired form one of the data points; and
  fitting the data points to the model.

The method may further comprise generating a T1 map using the estimated plurality of T1 times.

The model may be of the form $$S(t) = A - Be^{-\frac{Ct}{T1}},$$

wherein t is the time after the generation of the preparation pulse, and wherein A, B, and C are constants.

The constant B may comprise a measure of the efficiency of the preparation pulse. The measure of the efficiency of the preparation pulse may be an inversion factor if the preparation pulse is an inversion pulse and may be a saturation factor if the preparation pulse is a saturation pulse. The inversion or saturation factor may be measured or may be calculated using Bloch simulations.

Fitting the data points to the model may comprise:
  obtaining a dictionary comprising a plurality of dictionary entries, each dictionary entry being a potential solution to the model, the dictionary being generated by inputting a range of T1 values into the model; and
  searching the dictionary entries to find the optimal solution to the model for the data points, and using the optimal solution to estimate the T1 time for the data points.

Searching the dictionary entries to find the optimal solution for the data points may comprise searching two or more of the dictionary entries in parallel using a parallel processor.

Searching the dictionary entries to find the optimal solution for the data points may comprise searching through all of the dictionary entries in the dictionary to find the optimal solution.

During the searching of the dictionary entries, the pixel values of the data points may be scaled to each dictionary entry.

The range of T1 values may be between a minimum T1 value of greater than or equal to 50 ms and a maximum T1 value of less than or equal to 10000 ms.

The range of T1 values may increase in increments of between 0.01 ms and 100 ms between the minimum and maximum T1 values.

The preparation pulse may be an inversion pulse or a saturation pulse.

Prior to performing the fitting, the method may comprise correcting for motion between the MR images. The motion may be corrected for using an image registration algorithm or may use navigator signals during the MR pulse sequence.

Prior to performing the fitting, the method may comprise processing the MR images to recover information on the signal polarity of the longitudinal magnetization at the time of the image acquisition.

Processing the MR images to recover information of the signal polarity may comprise performing a phase sensitive inversion recovery process on the MR images.

The method may be performed by a processor. The processor may be a central processor unit (CPU) or a graphics processor unit (GPU). The processor may be a parallel processor.

The region of the subject may be or comprise all or part of the subject's heart. The region of the subject may thus be a myocardial region of the subject. The determined T1 time constant may thus be a determined T1 time for tissue within the myocardial region of the subject. In examples, where multiple T1 time constants are determined and used to generate a T1 map, the T1 map may be a myocardial T1 map.

According to a second aspect of the present disclosure, there is provided a computer readable medium having instructions recorded thereon on which, when executed by a computer, cause the computer to perform the method as described above in relation to the first aspect of the disclosure.

According to a third aspect of the present disclosure, there is provided an apparatus for performing the method as described above in relation to the first aspect of the disclosure. The apparatus may be a magnetic resonance (MR) apparatus.

DETAILED DESCRIPTION

Figure 1:
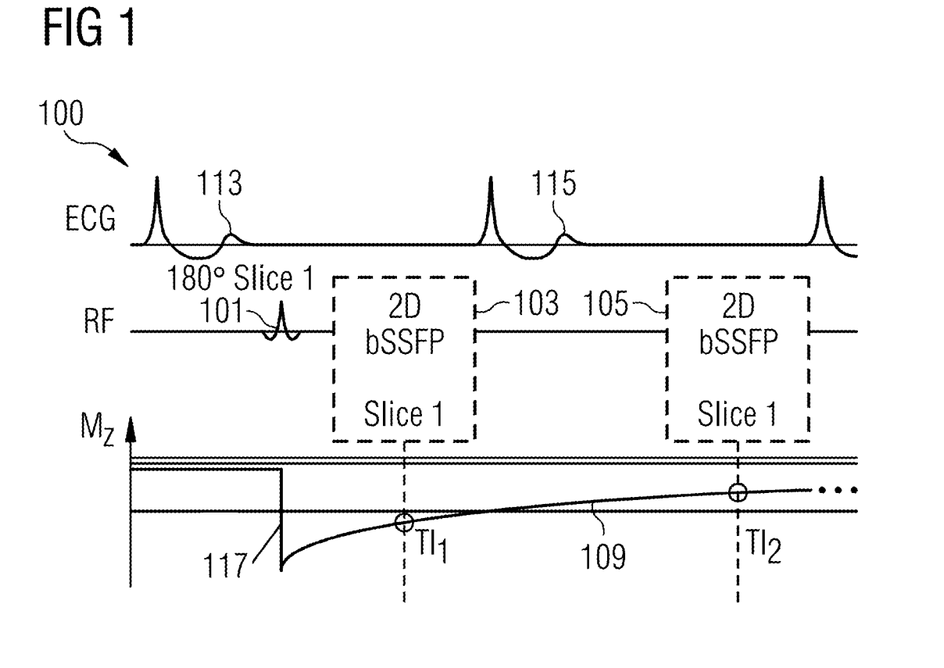
FIG. 1 shows an example MR pulse sequence diagram for obtaining MR images of a region of a subject.

FIG. 1 shows an example MR pulse sequence diagram 100 for obtaining MR images of a region of a subject. The MR pulse sequence diagram 100 shows different events arranged according to the time at which they occur. The top row of the MR pulse sequence diagram 100 represents the ECG signal of a subject as measured by an ECG apparatus. The middle row of the MR pulse sequence diagram represents the steps performed by an MR apparatus for generating the MR pulse. These include the generation of an excitation pulse 101 and the acquisition of image data 103, 105. The bottom row of the MR pulse sequence diagram represents the change in longitudinal magnetization, Mz, during the pulse sequence.

In this example, the ECG pulse 113 triggers the generation of an inversion pulse 101 by the MR apparatus. It can be seen from FIG. 1 that prior to the generation of the inversion pulse 101 the longitudinal magnetization, Mz, is aligned with the main magnetic field B0 of the MR apparatus. However, the inversion pulse 101 acts to tip the longitudinal magnetization through approximately 180 degrees as indicated by the arrow labelled 117 in FIG. 1. It can further be seen that after the generation of the inversion pulse 101, the longitudinal magnetization starts to recover.

In the diastole period of the same cardiac cycle as the generation of the inversion pulse 101, a first MR image data 103 of a region of the subject is acquired. It will be appreciated that the image data does not need to be acquired in the diastole period in all embodiments and instead the image data may be acquired during different periods of the cardiac cycle. Moreover, the acquisition of the images may not be dependent on or linked to the cardiac cycle of the subject. That may be, for example, if a non-cardiac region of the subject such as the liver is imaged. In this example, the first MR image data 103 is acquired using a 2D balanced steady-state Free Precession (bssFP) sequence. It can be seen that the first MR image data 103 is acquired at a first inversion time $TI_1$ after the generation of the inversion pulse 101. The subject then enters another cardiac cycle as indicated by the ECG pulse 115, this triggers the acquisition of second MR image data 105 in the diastole period of the cardiac cycle. The second MR image data 105 is acquired using another 2D bSSFP sequence. The second MR image data 105 is acquired at a second inversion time $TI_2$ after the generation of the inversion pulse 101. The MR image data 103 and 105 will be acquired as k-space data, but will then be converted into image data using conventional approaches.

bSSFP sequences as used in this example implementation are also known as "True FISP", "FIESTA" and "T2-FFE", and are widely known in MR imaging. A bSSFP sequence is a coherent balanced sequence, in which balanced gradients are used, namely for all three axes. This means that the gradient-induced dephasing is cancelled during a complete repetition of the sequence. The bSSFP sequence benefits from a high read-out efficiency due to the short echo times (TE) and repetition times (TR), which are on the order of milliseconds. A further advantage of bSSFP is the high signal-to-noise ratio that is achieved therewith.

The present disclosure is not limited to bSSFP type sequences and any image readout sequences may be used as appropriately selected by the skilled person. For example, gradient echo imaging may be used.

It can be seen that the first and second inversion times $TI_1$, $TI_2$ represent two different points on the longitudinal magnetization recovery curve 109. The longitudinal magnetization recovery curve will eventually (after sufficient inversion time) recover to have the value of the main magnetic field B0. The T1 time characterizes the rate at which the longitudinal magnetization recovers exponentially towards its equilibrium. The T1 time is dependent on the particular tissue within the region being imaged. For example, fluids have T1 time constants in the region of 1500-2000 ms, water based tissues have T1 time constants in the region of 400-1200 ms, and fat based tissues have T1 time constants in the region of 100-150 ms.

It will be appreciated that by determining a model of the longitudinal magnetization recovery curve and by fitting the obtained MR images 103, 105 to the model, the T1 time may be determined.

It will also be appreciated that different areas of the image (e.g. each pixel in an MR image) may have a different T1 times due to the particular tissue properties within that area of the image. Therefore, the fitting is performed in a pixel-wise fashion. In more detail, a pixel value is obtained from the same location in each of the MR images, e.g. the top-left hand corner pixel is obtained in the first MR image 103 and the top-left hand corner pixel is obtained in the second MR image 105. The pixel values of these data points and the time at which their respective MR image was acquired represent a data point. That is, a first data point (P1, $TI_1$) is obtained from the first MR image 103, and a second data point (P2, $TI_2$) is obtained from the second MR image 105, where P denotes the pixel value. The method of the present disclosure then fits these data points to a model with a single adjustable parameter to estimate the T1 time for the region of interest. The single adjustable parameter is a T1 value.

This fitting procedure may be repeated for a plurality of different locations in the MR images so that a plurality of T1 time constants are estimated. The plurality of estimated T1 times may then be used to generate a T1 map. It will be appreciated that a T1 map is a 2-dimensional array of T1 time values.

Significantly, the present disclosure uses a model with a single adjustable parameter to estimate the T1 time constant for the region of interest. The single adjustable parameter of the model is a T1 value. Existing T1 mapping approaches have used models with multiple adjustable parameters, such as a 2-parameter or a 3-parameter adjustable model. The multi-parameter adjustable models use other parameters such as the full longitudinal magnetization value and a bias term value in the model in addition to the T1 value.

A benefit of the model with a single adjustable parameter of the present disclosure is that it enables an exhaustive search to be performed. Such exhaustive searches are not practically possible within the time and resources constraints of a clinical environment with the use of multi-parameter models. This is because the dimensional search space of models with multiple adjustable models is too large to perform using such an exhaustive search. However, the reduced dimensional search space of the model with the single adjustable parameter according to the present disclosure enables such an exhaustive search to be performed. Models with multiple adjustable parameters typically require the use of a least-square optimiser to find a solution to the model. However, such models may get trapped in a local optimum during the optimisation process, which may result in the determination of an incorrect T1 time. By contrast, an exhaustive search enables the true global optimum to be estimated.

The use of a model with a single adjustable parameter of the present disclosure thus has the potential to improve the accuracy and robustness of the fitting process by enabling an exhaustive search to be performed.

Further, the model with a single adjustable parameter only requires two images for the T1 fitting process, which may help lead to a substantial reduction of the scan time, which in turn may reduce patient discomfort and cost. Three-parameter models require at least three images to perform the T1 fitting, and while two-parameter models can get by with two images, the impracticality of an exhaustive search may mean that a non-optimal local solution is obtained, rather than the true global solution.

The model with a single adjustable parameter in accordance with the present disclosure is of the form:

$$S(t) = A - Be^{-\frac{Ct}{T1}}$$

wherein t is the time after the generation of the preparation pulse, and wherein A, B, and C are constants.

In one example, A may be 1.

In one example, B may incorporate measure of the efficiency of the preparation pulse. In the example of FIG. 1, the preparation pulse is an inversion pulse so B will be a measure of the inversion efficiency. In other examples, the preparation pulse may be a saturation pulse, and in these examples B will be a measure of the saturation efficiency. The measure of the efficiency of the preparation pulse is measured/calculated prior to the fitting of the model with a single adjustable parameter, and is thus not an adjustable parameter, but a constant. In other words, while existing multi-parameter models may include a measure of the efficiency of the parameter of the models, they are not the same as the model with the single adjustable parameter in accordance with the present disclosure. This is because the fitting procedure of the existing multi-parameter models requires adjusting multiple parameters including the measure of the inversion efficiency and the T1 value during the fitting procedure. By contrast, the present disclosure only varies the T1 value during the fitting procedure because the T1 value is the single adjustable parameter for the model.

The measure of the efficiency of the preparation pulse may be determined through measurement. In other examples, the measure of the efficiency of the preparation pulse may be estimated through use of Bloch simulations. In one example, the constant B is of the form D+δ where D is a constant and where δ is a measure of the efficiency of the inversion pulse. In particular, δ may be an inversion factor. The inversion factor is related to the inversion efficiency as defined by the following equation: $e=\frac{1}{2}(1+\delta)$.

The measure of the inversion efficiency, such as the inversion factor, may be calculated using Bloch simulations for the inversion pulse. Bloch simulations are known to the skilled person and involve the use of Bloch equations. The skilled person readily knows how to calculate the inversion factor using Bloch equations. The inversion factor may depend on properties such as the pulse duration, the frequency range of the inversion pulse, the shape of the inversion pulse the peak amplitude of the inversion pulse, B0 inhomogeneity and B1 inhomogeneity.

In one example, the particular inversion pulse may be selected during a design procedure, e.g. such that the chosen inversion pulse used in the method may result in the highest possible inversion factor.

The design procedure may involve simulating hyperbolic secant (HS) or tangent/hyperbolic tangent (tan/tan h) adiabatic waveforms with a number of different design parameters. For example, different pulse durations, frequency range, shape parameters, and peak amplitudes may be used to simulate a number of different HS or tan/tan h waveforms. The inversion factor may be calculated for each of these waveforms, and the design of waveform that maximized the inversion factor for a predetermined range of amplitude and off-resonance values may be selected. Generally, tan/tan h waveforms are expected to have better performance to HS waveforms, and so HS waveforms may not be considered in the design procedure.

While the above examples focus on inversion pulses and inversion factors. Similar approaches may be used in relation to saturation pulses and saturation factors. Here, a saturation factor is similar to an inversion factor in that it relates to the efficiency of the preparation (saturation) pulse.

In one example, D is 1.

It will be appreciated that the value of δ may depend on factors such as the properties of the preparation pulse, the properties of the tissue being imaged, and the properties of the MR apparatus. Generally, δ may have a value of between 0 and 1. In some examples, δ may be between 0.9 and 1. In some examples, δ may be between 0.92 and 0.98, and may in particular be between 0.95 and 0.97. In one example, δ may have a value of 0.96. The present disclosure is not limited to any particular value of δ.

Incorporating a measure of the efficiency of the inversion pulse into the model may be beneficial in providing a slice profile correction.

In one example, C may be 1.

In one example, the model with a single adjustable parameter is defined as: $S(t)=1-(1+\delta)e^{-t/T1}$.

While benefits may be obtained by performing an exhaustive search of the model with a single adjustable parameter, this is not required in all embodiments of the present disclosure. In particular, in some embodiments the pixel-wise fitting may be performing using non-exhaustive optimisation techniques, such as through use of a least square optimiser.

In other examples, an exhaustive search using the model with a single adjustable parameter is performed.

In one example, the exhaustive search comprises obtaining a dictionary comprising a plurality of dictionary entries. Each of the dictionary entries is a potential solution to the model with a single adjustable parameter. The dictionary is generated by inputting a range of T1 times into the model with a single adjustable parameter. The dictionary thus comprises a number of potential solutions for the model with a single adjustable parameter.

In this example, the fitting approach thus comprises finding the optimal of these solutions for the data points. That is, the dictionary entries are searched to find the optimal solution to the model for the data points. This optimal solution is then used estimate the T1 time. That is, the optimal solution for both data points simultaneously.

It will be appreciated that this exhaustive search may then be performed for some or all of the other pixels in the MR images. That is, a pixel-wise exhaustive search may be used to estimate a plurality of T1 times. The plurality of T1 times may then be used to generate a T1 map.

The fitting of the data points to the model may be performed using a parallel processor. For example, the searching of the dictionary entries to find the optimal solution for the data points may comprise searching two or more of the dictionary entries in parallel using a parallel processor. Other ways of implementing the present disclosure using a parallel processor may also be provided.

As explained above, the dictionary is generated by inputting a range of T1 times into the model with a single adjustable parameter. The dictionary thus comprises a number of dictionary entries, where the number of dictionary entries corresponds to the number of T1 times in the range.

In one example, the range of T1 times are between a minimum T1 value of greater than or equal to 50 ms and a maximum T1 value of less than or equal to 10000 ms. The range of T1 times may increase in increments of between 0.01 ms and 100 ms between the minimum and maximum T1 values.

It will be appreciated that different tissues have different T1 times constants. For example, fluids have T1 time constants in the region of 1500-2000 ms, water based tissues have T1 time constants in the region of 400-1200 ms, and fat based tissues have T1 time constants in the region of 100-150 ms. These T1 times may be affected by the presence of different imaging contrasts. The minimum and maximum T1 values may be selected based on the likely tissue in the region of interest or may be selected such that the range of T1 values includes the estimated T1 times for different fluids. The selection of the minimum and maximum T1 values may take into account whether an imaging contrast has been applied to the subject.

In one example, the minimum T1 value may be selected such that it is less than or equal to 100 ms. The minimum T1 value may be greater than or equal to 50 ms and may be less than or equal to 100 ms. It will be appreciated that a higher T1 minimum value may be selected based on the region of the subject to be imaged. For example, the minimum T1 value may be less than or equal to 400 ms and may be less than or equal to 1500 ms.

In one example, the maximum T1 value may be selected such that it is greater than or equal to 2000 ms. The maximum T1 value may be greater than or equal to 2000 ms and may be less than or equal to 10000 ms. It will be appreciated that a lower T1 minimum value may be selected based on the region of the subject to be image. For example, the maximum T1 value may be greater than or equal to 150 ms, and may be greater than or equal to 1200 ms.

It will be appreciated that the increment by which to increase the T1 times between the minimum and maximum T1 value may be selected as appropriate by the skilled person. The skilled person will appreciate that the distance between the minimum T1 value and the maximum T1 value, as well as the T1 increment value chosen, will determine how many dictionary entries are generated. For given minimum and maximum T1 values, a smaller increment value will provide more dictionary entries and thus potentially a more accurate model fitting result. However, as there will be more dictionary entries, the number of processing steps required to generate the result of the model fitting procedure will be increased. This is because there will be more dictionary entries to compare to the data points.

The skilled person may thus select an increment value based on the desired accuracy of the model fitting, and the available computational resource, and the desired processing time for the model. For example, in a clinical setting a larger increment value may be selected such that results are able to provided quickly using modest computing resources.

The minimum increment value may be 0.01 ms, but may be even lower than this in view of the desired minimum and maximum T1 values for the range, the desired number of dictionary entries, the computational resources available, the desired processing time, and the desired accuracy for the model fitting. In some examples a minimum increment value may be 0.001 ms or even 0.0001 ms.

The maximum increment value may be 100 ms, but may be even higher than this in view of the desired minimum and maximum T1 values for the range, the desired number of dictionary entries, the computational resources available, the desired processing time, and the desired accuracy for the model fitting. In some examples a maximum increment value may be 200 ms or even 500 ms.

The minimum T1 value may be greater than or equal 50 ms and may be less than or equal to 300 ms. The minimum T1 value may be greater than or equal 75 ms and may be less than or equal to 300 ms. The minimum T1 value may be greater than or equal 100 ms and may be less than or equal to 300 ms. The minimum T1 value may be greater than or equal to 125 ms and may be less than or equal to 300 ms. The minimum T1 value may be greater than or equal to 150 ms and may be less than or equal to 300 ms.

The minimum T1 value may be greater than or equal 50 ms and may be less than or equal to 275 ms. The minimum T1 value may be greater than or equal 50 ms and may be less than or equal to 250 ms. The minimum T1 value may be greater than or equal to 50 ms and may be less than or equal to 225 ms. The minimum T1 value may be greater than or equal to 50 ms and may be less than or equal to 200 ms. The minimum T1 value may be greater than or equal to 50 ms and may be less than or equal to 175 ms. The minimum T1 value may be greater than or equal to 50 ms and may be less than or equal to 150 ms.

The maximum T1 value may be greater than or equal to 1000 ms and may be less than or equal to 3000 ms. The maximum T1 value may be greater than or equal to 1400 ms and may be less than or equal to 3000 ms. The maximum T1 value may be greater than or equal to 1800 ms and may be less than or equal to 3000 ms. The maximum T1 value may be greater than or equal to 2200 ms and may be less than or equal to 3000 ms. The maximum T1 value may be greater than or equal to 2600 ms and may be less than or equal to 3000 ms.

The maximum T1 value may be greater than or equal to 1000 ms and may be less than or equal to 2600 ms. The maximum T1 value may be greater than or equal to 1000 ms and may be less than or equal to 2200 ms. The maximum T1 value may be greater than or equal to 1000 ms and may be less than or equal to 1800 ms. The maximum T1 value may be greater than or equal to 1000 ms and may be less than or equal to 1400 ms.

The range of T1 times may increase in increments of between 0.4 ms and 10 ms between the minimum and maximum T1 values. The range of T1 times may increase in increments of between 0.6 ms and 10 ms between the minimum and maximum T1 values. The range of T1 times may increase in increments of between 0.8 ms and 10 ms between the minimum and maximum T1 values. The range of T1 times may increase in increments of between 1 ms and 10 ms between the minimum and maximum T1 values. The range of T1 times may increase in increments of between 2 ms and 10 ms between the minimum and maximum T1 values. The range of T1 times may increase in increments of between 4 ms and 10 ms between the minimum and maximum T1 values. The range of T1 times may increase in increments of between 6 ms and 10 ms between the minimum and maximum T1 values. The range of T1 times may increase in increments of between 8 ms and 10 ms between the minimum and maximum T1 values.

The range of T1 times may increase in increments of between 0.2 ms and 8 ms between the minimum and maximum T1 values. The range of T1 times may increase in increments of between 0.2 ms and 6 ms between the minimum and maximum T1 values. The range of T1 times may increase in increments of between 0.2 ms and 4 ms between the minimum and maximum T1 values. The range of T1 times may increase in increments of between 0.2 ms and 2 ms between the minimum and maximum T1 values. The range of T1 times may increase in increments of between 0.2 ms and 1 ms between the minimum and maximum T1 values. The range of T1 times may increase in increments of between 0.2 ms and 0.8 ms between the minimum and maximum T1 values. The range of T1 times may increase in increments of between 0.2 ms and 0.6 ms between the minimum and maximum T1 values. The range of T1 times may increase in increments of between 0.2 ms and 0.4 ms between the minimum and maximum T1 values.

In one example, the minimum T1 value is 150 ms, the maximum T1 value is 2000 ms, and the T1 value increases in increment of 1 ms between the minimum T1 value and the maximum T1 value. In other words, the range of T1 values is [150, 151, 152, ..., 1998, 1999, 2000] ms.

In some examples of the present disclosure, during the searching of the dictionary entries, the pixel values of the data points are scaled to each dictionary entry. This may be because the dictionary entries have values of between 0 and 1, whereas the measured pixel values obtained from the image data may have arbitrary values. In one example, the scaling is performing using the following equation:

$$P_{scaled} = P \times \overline{S|_{dict}} / \overline{|P|}$$

In this example equation, $P_{scaled}$ denotes the scaled pixel values. P denotes the original pixel values. $\overline{S|_{dict}}$ denotes the signal average over a dictionary entry. That is, the dictionary entry will comprise a plurality of signal values each representing a different time after the generation of the preparation pulse (inversion or saturation time). $\overline{|P|}$ denotes the average of the pixel values for the data points. That is, there are a plurality of data points each comprising a pixel value, and these pixel values are averaged.

In some examples of the present disclosure, the MR images are processed prior to performing the fitting to recover information on the signal polarity of the longitudinal magnetization at the time of the image acquisition. Referring to FIG. 1, it can be seen that the preparation pulse 101 tips the longitudinal magnetization to have a negative polarity, which recovers to become positive and eventually fully recovers to be aligned with the main magnetic field B0. Typically, image acquisition processes do not recover this change in polarity, but instead only recover the absolute signal values. Thus, the MR image 103 may not contain information that reflects that the signals have a negative polarity, and the MR image 105 may not contain information that reflects the signals have a positive polarity. To improve the accuracy of the fitting procedure, the present disclosure may recover this polarity information.

In one example, the polarity is recovered using a Phase Sensitive Inversion Recovery (PSIR) approach. Typically, PSIR approaches assume that the image obtained with the longest time after the generation of the preparation pulse 101 must have a positive polarity, and use this image as a reference for the PSIR reconstruction. For example, the image with the longest inversion time may be used to remove the background phase of all of the other images on a pixel-by-pixel basis. The real part of the resultant images will then have the correct polarity. Significantly, it has been found that this approach may not work in all embodiments of the present disclosure as the images may be acquired at a relatively short time after the preparation pulse, and enough time may not have elapsed for there to be a positive signal polarity. Because of this, the present disclosure may instead use the obtained MR image 103 acquired the shortest time after the generation of the preparation pulse 101 as the reference by assuming that this MR image has a negative signal polarity.

It has been found that the hypothesis that the earliest obtained MR image 103 has a negative signal polarity is valid for any T1 time which is greater than the ratio of the minimum time at which an image was acquired after the generation of the preparation pulse (TI1 in the example of FIG. 1) to log(1+δ), where δ is the measure of the efficiency of the preparation pulse, e.g. the inversion or saturation factor. That is, the hypothesis is valid as long as $$T1 > \frac{TI_{min}}{\log(1 + \delta)}.$$

Performing a PSIR is not required in all embodiments to recover the signal polarity, instead other approaches such as a multi-fitting approach may be used to recover the signal polarity. In one example multi-fitting approach, a first fit is performed assuming that all data points are positive. A second fit is then performed that inverts the polarity of the first data point. A third fit may then be performed that inverts the polarity of the first two data points. Further fitting steps may be performed. The fit with the lowest residual error may then be selected.

In some examples, the polarity of the pixel data may be restored before scaling the pixel data to the dictionary entries. That is, in the equation $P_{scaled}=P \times \overline{|S_{dict}|}/\overline{|P|}$, P may refer to the polarity corrected pixel data.

The above example shows estimating T1 times using only two MR images 103, 105, but it will be appreciated that the present disclosure is not limited to using only two MR images. That is, any number of MR images greater than or equal to two may be used to estimate the T1 times. It will be appreciated that increasing the number of images may increase the scan time and the processing time, but may provide a more accurate estimate of the T1 time.

The number of MR images used may be between 2 and 20. The number of MR images used may be between 2 and 15. The number of MR images used may be between 2 and 10. The number of MR images used may be between 2 and 5. The number of MR images used may be between 5 and 20. The number of MR images used may be between 10 and 20. The number of MR images used may be between 15 and 20.

The above example shows use of a MOLLI type MR pulse sequence in which 2 images are obtained. It will be appreciated that the present disclosure is not limited to MOLLI type sequence recovery type sequence for use in estimating T1 may be used. The recovery type system may be an inversion recovery type sequence or a saturation recovery type sequence.

Figure 2:
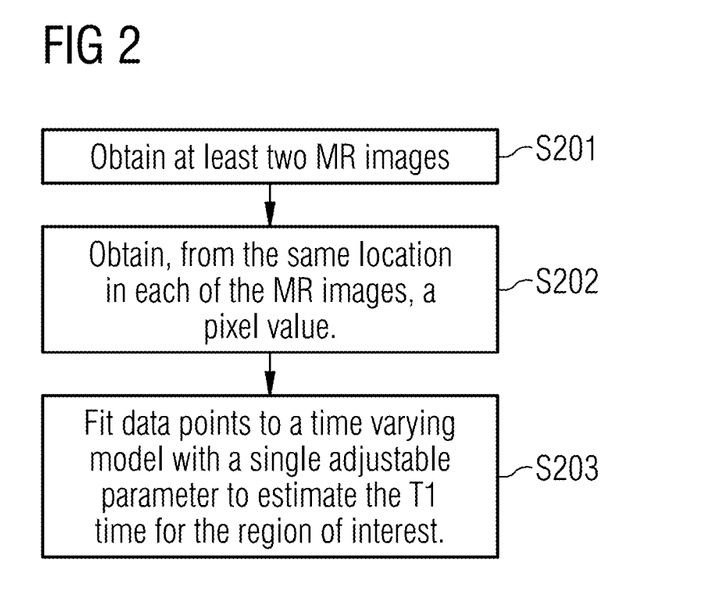
FIG. 2 shows a process diagram for performing a method in accordance with aspects of the present disclosure.

FIG. 2 shows a process diagram for performing a method in accordance with aspects of the present disclosure. The method is for estimating a longitudinal magnetic relaxation, T1, time for a region of a subject.

Step 201 of the method comprises obtaining at least two magnetic resonance, MR, images of the region of the subject, the MR images being acquired at different times after the generation of a preparation pulse during a MR pulse sequence.

Step 202 of the method comprises obtaining, from the same location in each of the MR images, a pixel value, wherein each of the pixel values and the time at which their respective MR image was acquired form a data point.

Step 203 of the method comprises fitting the data points to a model with a single adjustable parameter to estimate the T1 time for the region of interest, wherein the single adjustable parameter is a T1 value.

Figure 3:
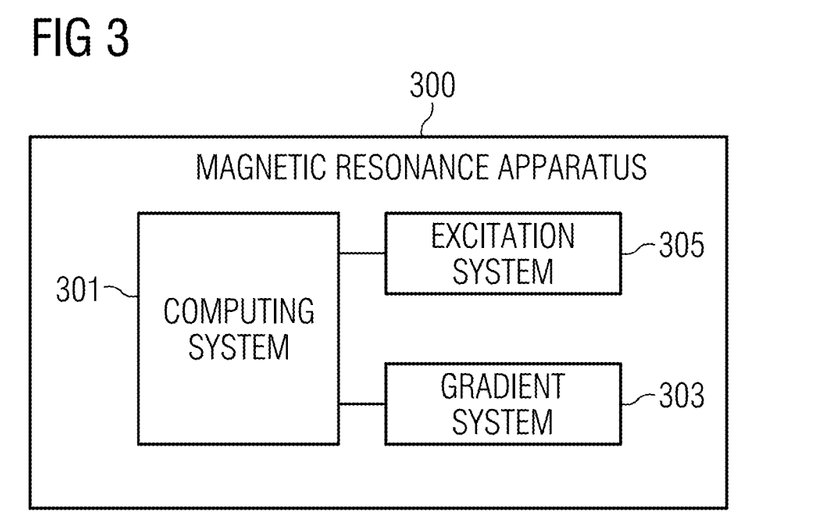
FIG. 3 shows an example MR apparatus 300 according the second aspect of the disclosure.

FIG. 3 shows an example MR apparatus 300 according the second aspect of the disclosure. The MR apparatus 300 comprises a computing system 301, a gradient system 303, and an excitation system 305.

The gradient system 303 is configured to apply a magnetic field gradient. The gradient system 303 may be configured to apply magnetic field gradients along three spatial axes.

The excitation system 305 may comprise a transmitter (not shown) and a receiver (not shown). The excitation system 305 can be an RF system with one or more RF coils (not shown). The excitation system 305 is configured to apply an excitation pulse to the subject and to receive signals from the subject.

The MR apparatus 300 includes a magnet (not shown) for establishing a stationary magnetic field. The magnet can include a permanent magnet, a superconducting magnet or other type of magnet.

The computing system 301 is in communication with the excitation system 305, and the gradient system 303 for controlling these components. The computing system 301 is configured to receive the signals from the excitation system 305.

The computing system 301 is further configured to execute program code to control the gradient system 303 and the excitation system 305 to generate a MR pulse sequence. The MR pulse sequence may be a pulse sequence for obtaining MR images for use in estimating T1 times in accordance with the present disclosure.

The computing system 301 is configured to execute code to process the MR images so as to estimate the T1 time in accordance with the present disclosure. The computing system 301 could be an integrated component of the MR apparatus 300. The computing system 301 could be a unit of a desktop computer, a workstation, a server, or a laptop computer.

The method in accordance with the present disclosure may be performed by a stand-alone computer or network of computers that are not directly associated with an MR apparatus. The computer or network of computers may have a central processing unit (CPU) or a graphics processing unit (GPU) for performing the method according to the present disclosure. The CPU or GPU may be a parallel processor. Some or all of the aspects of the present disclosure may be parallelised using the parallel processor.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements.

The described and illustrated embodiments are to be considered as illustrative and not restrictive in character, it being understood that only the preferred embodiments have been shown and described and that all changes and modifications that come within the scope of the disclosure. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the disclosure as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Although a few preferred embodiments have been shown and described, it will be appreciated by those skilled in the art that various changes and modifications might be made without departing from the scope of the disclosure, as defined in the appended claims.

The invention claimed is:

1. A method of estimating a longitudinal magnetic relaxation T1 time constant for a region of a subject, the method comprising:
providing a computer with at least two magnetic resonance (MR) images of the region of the subject that were respectively acquired at different times after generation of a preparation pulse during a MR pulse sequence;
in said computer, analyzing said at least two MR images in order to obtain, from the same location in each of the MR images, a pixel value, wherein each of the pixel values and the time at which their respective MR image was acquired form a data point;
in said computer, providing a plurality of different models representing said magnetic relaxation by varying a single adjustable parameter to estimate the T1 time constant for the region of interest, wherein the single adjustable parameter represents the T1 time constant within the model, wherein the models differ according to a respective value of the single adjustable parameter employed therein;
in said computer, selecting a model which provides the best fit from amongst the plurality of different models; and
in said computer, fitting the data points to the model that was selected.

2. A method as claimed in claim 1, wherein said fitting the data points to the model comprises calculating an optimal value of the single adjustable parameter to be employed in the model.

3. A method as claimed in claim 1, wherein the model is of the form $$S(t) = A - Be^{-\frac{Ct}{T1}},$$

t is the time after the generation of the preparation pulse, and A, B, and C are constants.

4. A method as claimed in claim 3, wherein the constant B comprises a measure of the efficiency of the preparation pulse.

5. A method as claimed in claim 1, wherein the preparation pulse is an inversion pulse or a saturation pulse.

6. A method as claimed in claim 1, wherein prior to performing the fitting, the method comprises correcting for motion between the MR images.

7. A method as claimed in claim 1, wherein prior to performing the fitting, the method comprises processing the MR images to recover information on the signal polarity of the longitudinal magnetization at the time of the image acquisition.

8. A method as claimed in claim 7, wherein the processing the MR images to recover information of the signal polarity comprises performing a phase sensitive inversion recovery process on the MR images.

9. A non-transitory computer readable medium having instructions recorded thereon on which, when executed by a computer, cause a computer to perform the method as claimed in claim 1.

10. A method of estimating a longitudinal magnetic relaxation T1 time constant for a region of a subject, the method comprising:
providing a computer with at least two magnetic resonance (MR) images of the region of the subject that were respectively acquired at different times after generation of a preparation pulse during a MR pulse sequence;

in said computer, analyzing said at least two MR images in order to obtain, from the same location in each of the MR images, a pixel value, wherein each of the pixel values and the time at which their respective MR images was acquired form a data point;

in said computer, fitting the data points to a model representing said magnetic relaxation by varying a single adjustable parameter to estimate the T1 time constant for the region of interest, wherein the single adjustable parameter represents the T1 time constant within the model;

in said computer, estimating a plurality of T1 times, wherein each of the T1 times is for a different location in the MR images;

for each of the different locations in the MR images, obtaining, from the location in each of the MR images, a pixel value, wherein each of the pixel values and the time at which their respective MR image was acquired form one of the data points; and fitting the data points to the model.

11. A method as claimed in claim 10, further comprising: generating a T1 map using the estimated plurality of T1 times.

12. A method of estimating a longitudinal magnetic relaxation T1 time constant for a region of a subject, the method comprising:

providing a computer with at least two magnetic resonance (MR) images of the region of the subject that were respectively acquired at different times after generation of a preparation pulse during a MR pulse sequence;

in said computer, analyzing said at least two MR images in order to obtain, from the same location in each of the MR images, a pixel value, wherein each of the pixel values and the time at which their respective MR images was acquired form a data point;

in said computer, fitting the data points to a model representing said magnetic relaxation by varying a single adjustable parameter to estimate the T1 time constant for the region of interest, wherein the single adjustable parameter represents the T1 time constant within the model, wherein the fitting the data points to the model comprises:

obtaining a dictionary comprising a plurality of dictionary entries, each dictionary entry being a potential solution to the model, wherein the dictionary is generated by inputting a range of T1 values into the model; and searching the dictionary entries to find the optimal solution to the model for the data points, and using the optimal solution to estimate the T1 time for the data points.

13. A method as claimed in claim 12, wherein the searching the dictionary entries to find the optimal solution for the data points comprises searching two or more of the dictionary entries in parallel using a parallel processor.

14. A method as claimed in claim 12, wherein the searching the dictionary entries to find the optimal solution for the data points comprises searching through all of the dictionary entries in the dictionary to find the optimal solution.

15. A method as claimed in claim 12, further comprising: scaling, during the searching of the dictionary entries, the pixel values of the data points to each dictionary entry.

16. A method as claimed in claim 12, wherein the range of T1 values are between a minimum T1 value of greater than or equal to 50 ms and a maximum T1 value of less than or equal to 10000 ms.

17. A method as claimed in claim 12, further comprising: increasing the range of T1 values in increments of between 0.01 ms and 100 ms between the minimum and maximum T1 values.

* * * * *